United States Patent
Yu et al.

(10) Patent No.: US 11,632,868 B2
(45) Date of Patent: Apr. 18, 2023

(54) ADAPTOR FOR PORTABLE HARD DISK

(71) Applicant: LUXSHARE PRECISION INDUSTRY COMPANY LIMITED, Shenzhen (CN)

(72) Inventors: Liang Yu, Shenzhen (CN); ZhongYuan Lai, Shenzhen (CN)

(73) Assignee: LUXSHARE PRECISION INDUSTRY COMPANY LIMITED, Shenzhen (CN)

( * ) Notice: Subject to any disclaimer, the term of this patent is extended or adjusted under 35 U.S.C. 154(b) by 118 days.

(21) Appl. No.: 17/242,876

(22) Filed: Apr. 28, 2021

(65) Prior Publication Data
US 2022/0071038 A1    Mar. 3, 2022

(30) Foreign Application Priority Data
Aug. 25, 2020    (CN) .................. 202010862310.X

(51) Int. Cl.
*H01R 13/639*    (2006.01)
*H05K 5/02*    (2006.01)
(Continued)

(52) U.S. Cl.
CPC ......... *H05K 5/0286* (2013.01); *H01R 13/631* (2013.01); *H01R 13/639* (2013.01); *H01R 31/06* (2013.01)

(58) Field of Classification Search
CPC .. H01R 13/631; H01R 13/639; H01R 13/629; H01R 13/6275; H01R 13/62905;
(Continued)

(56) References Cited

U.S. PATENT DOCUMENTS 3,932,016 A  *  1/1976  Ammenheuser ..... H05K 7/1418
                                                      361/801
4,232,926 A     11/1980  Inouye et al.
(Continued)

FOREIGN PATENT DOCUMENTS

CN    201181579 Y    1/2009
CN    101533983 A    9/2009
(Continued)

*Primary Examiner* — Thanh Tam T Le
(74) *Attorney, Agent, or Firm* — Birch, Stewart, Kolasch & Birch, LLP

(57) ABSTRACT

The present disclosure provides an adaptor, comprising an adapting bracket, an adapting member, and at least one locking component. The adapting bracket comprises a chute comprising two opposite sidewalls and a bottom wall. The bottom wall is disposed between the two sidewalls. The adapting member is disposed on the adapting bracket. The adapting member comprises an adapting interface and is in communicating with the chute. The at least one locking component is disposed in the adapting bracket. Each of the locking components comprises a locking member movably extending into the chute. When an electronic component is inserted in the chute, a mating interface of the electronic component is connected to the adapting interface, and the locking member is inserted into an engaging groove of the electronic component. By protecting the electronic component with the adapting bracket, it is possible to avoid damage to the electronic component from impacts.

12 Claims, 9 Drawing Sheets

(51) Int. Cl.
*H01R 13/631* (2006.01)
*H01R 31/06* (2006.01)

(58) Field of Classification Search
CPC .... H01R 31/06; H01R 12/00; H01R 12/7005; H01R 12/721; H05K 5/0286
See application file for complete search history.

(56) References Cited

U.S. PATENT DOCUMENTS

| | | | | |
|---|---|---|---|---|
| 5,036,430 | A * | 7/1991 | Hills | H05K 5/0286 235/492 |
| 5,155,663 | A * | 10/1992 | Harase | G06K 19/07743 361/740 |
| 5,187,643 | A * | 2/1993 | I-Shou | G11B 33/124 |
| 5,227,953 | A * | 7/1993 | Lindberg | G06F 1/1632 361/679.41 |
| 5,290,174 | A * | 3/1994 | Woratyla | H01R 12/716 439/59 |
| 5,305,180 | A * | 4/1994 | Mitchell | G06F 1/1656 361/728 |
| 5,619,660 | A * | 4/1997 | Scheer | G06F 13/409 710/301 |
| 5,653,596 | A * | 8/1997 | Banakis | G06K 7/0047 361/752 |
| 5,740,012 | A * | 4/1998 | Choi | G06F 1/187 439/157 |
| 5,889,649 | A * | 3/1999 | Nabetani | H05K 5/0265 361/740 |
| 5,889,656 | A * | 3/1999 | Yin | H01R 12/7005 361/740 |
| 5,943,218 | A * | 8/1999 | Liu | H05K 7/1405 361/801 |
| 6,050,848 | A * | 4/2000 | Yao | H05K 5/0282 439/946 |
| 6,287,143 | B1 * | 9/2001 | Lwee | H01R 12/7005 439/541.5 |
| 6,297,951 | B1 * | 10/2001 | Lee | G06F 1/184 361/679.33 |
| 7,634,784 | B2 * | 12/2009 | Christie, Jr. | G11B 23/0316 360/99.06 |
| 10,103,462 | B1 * | 10/2018 | Herring | H01R 12/737 |
| 2016/0286678 | A1 | 9/2016 | Venugopal et al. | |

FOREIGN PATENT DOCUMENTS

| | | |
|---|---|---|
| CN | 101751974 A | 6/2010 |
| CN | 102880233 A | 1/2013 |
| CN | 206505721 U | 9/2017 |
| CN | 208608504 U | 3/2019 |
| CN | 208767546 U | 4/2019 |
| CN | 211062974 U | 7/2020 |
| TW | 201436693 A | 9/2014 |
| TW | 201514656 A | 4/2015 |
| TW | I674575 B | 10/2019 |
| TW | I676882 B | 11/2019 |

* cited by examiner

ADAPTOR FOR PORTABLE HARD DISK

CROSS-REFERENCE TO RELATED APPLICATION

This application claims the priority benefit of Chinese Patent Application Serial Number 202010862310.X, filed on Aug. 25, 2020, the full disclosure of which is incorporated herein by reference.

BACKGROUND

Technical Field

The present disclosure relates to the technical field of adapting device, particularly to an adaptor.

Related Art

Computers have become increasingly popular with the development of computer technology, and consumers' demand for computer products is also becoming increasingly diversified. Being hardware of a host, the hard disk of a conventional desktop computer is generally fixed in the case, unlike other peripheral devices that can be removed or plugged/unplugged at any time, the hard disk cannot be disassembled and replaced easily. With the development of hard disk technology, the shockproof performance of hard disks has been improved, making portable hard disks available to the market in large numbers. However, conventional portable hard disk, as a portable device, is connected to a computer through data cable or interface from external, which is easy to be impacted by externals to be detached from a computer, specifically, when the portable hard disk is connecting with and accessing the computer to cause damage to the portable hard disk. Thus, data in the mobile hard disk would hardly be kept properly under such risks.

SUMMARY

The embodiments of the present disclosure provide an adaptor tended to solve the problem that conventional portable hard disk is easy to be impacted to be damaged as it is connected to a computer through a data cable or interface.

The present disclosure provides an adaptor, comprising an adapting bracket, an adapting member, and at least one locking component. The adapting bracket comprises a chute comprising two opposite sidewalls and a bottom wall. The bottom wall is disposed between the two sidewalls. The adapting member is disposed on the adapting bracket. The adapting member comprises an adapting interface and is in communicating with the chute. The at least one locking component is disposed in the adapting bracket. Each of the locking components comprises a locking member movably extending into the chute. When an electronic component is inserted in the chute, a mating interface of the electronic component is connected to the adapting interface, and the locking member is inserted into an engaging groove of the electronic component.

In the embodiments of the present disclosure, by disposing the adapting member and at least one locking component onto the adapting bracket, the mating interface of the electronic component is connected to the adapting interface of the adapting member, and the locking member of each of the locking components is inserted into a corresponding engaging groove when the electronic component is inserted in the chute of the adapting bracket to fix the electronic components in the adapting bracket. Besides, since electronic components are connected to computers or other equipment through adaptors, they can be protected by the adapting bracket to avoid being damaged by impact. Furthermore, the adaptor can be installed on a computer or other equipment to form a built-in configuration, of which the connection or interfaces between the adaptor and the computer or other equipment are in the computer or other equipment to prevent the adaptor from being pulled to detach from the computer or other equipment by external forces and to prevent electronic components from detaching from the computer or other equipment and further damage when they are connected to the computer or other equipment for data transmission.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
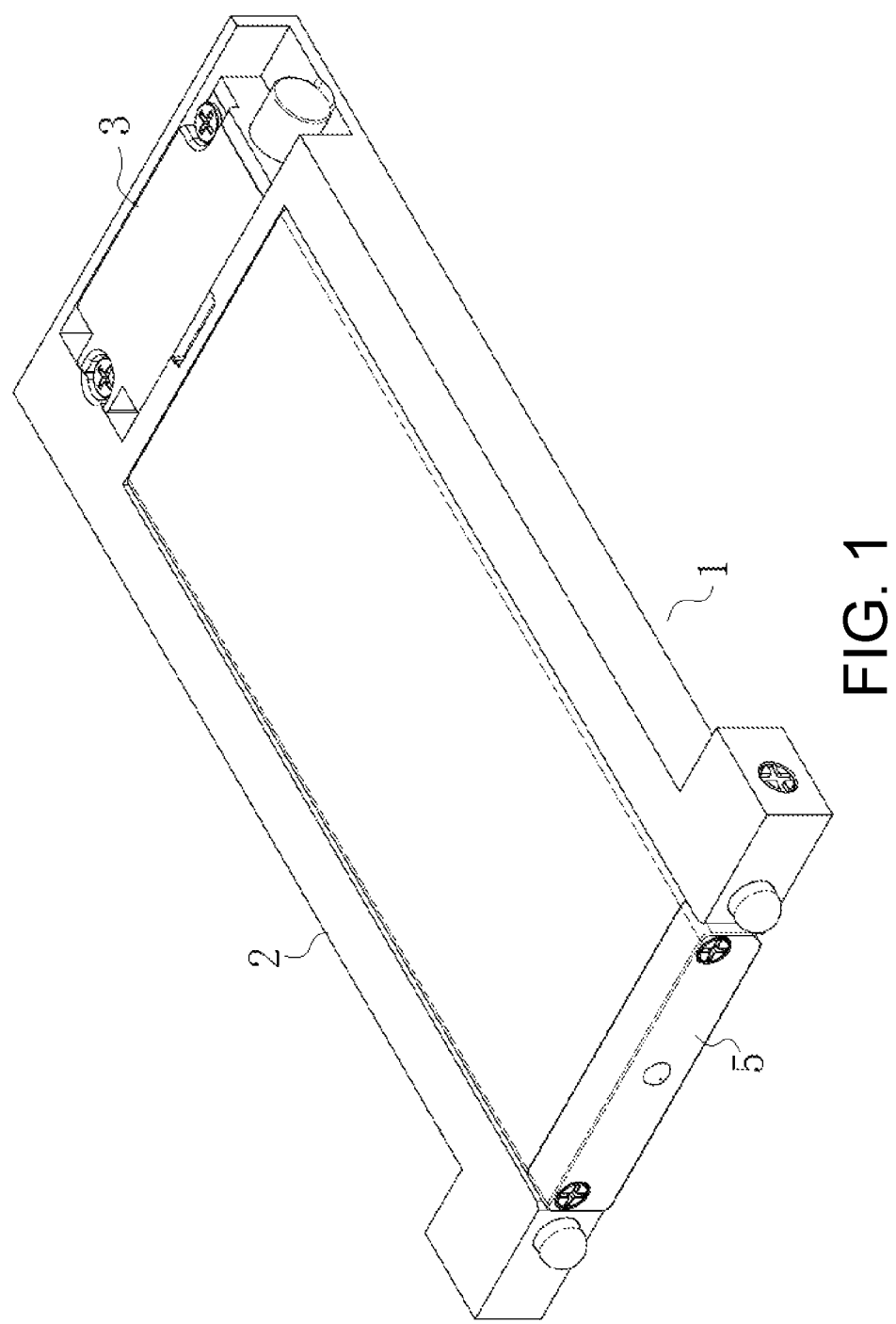
FIG. 1 is a perspective view of an electronic component inserted into an adaptor of an embodiment of the present disclosure.
Figure 2:
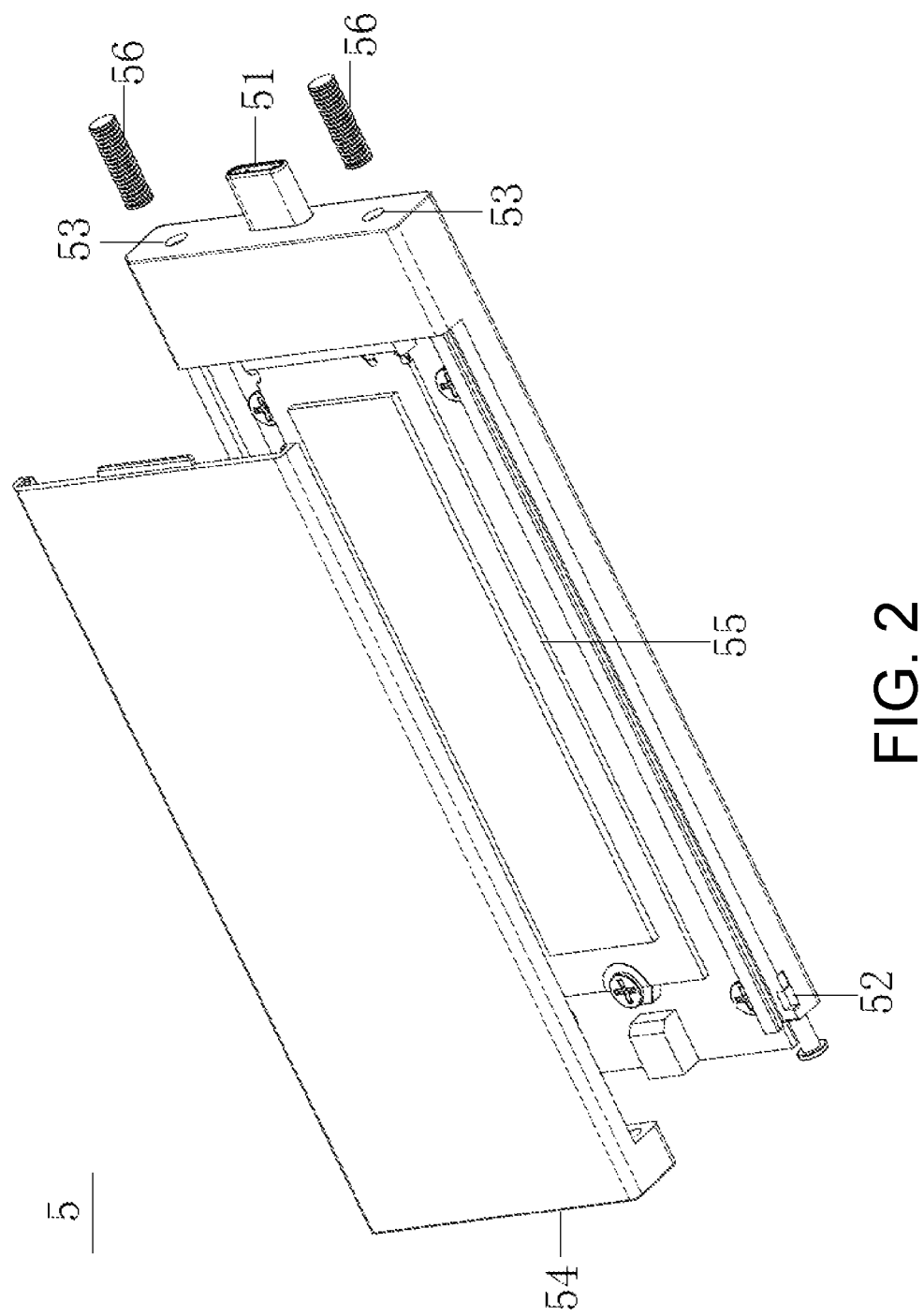
FIG. 2 is a partially exploded view of an electronic component of an embodiment of the present disclosure.

FIG. 1 is a perspective view of an electronic component inserted into an adaptor of an embodiment of the present disclosure. FIG. 2 is a partially exploded view of an electronic component of an embodiment of the present disclosure. As shown in the figures, an adaptor 1 of this embodiment is mainly for adapting an electronic component 5. In this embodiment, the electronic component 5 is a box-shaped or box-like product, for example, an adaptor box accommodating a SSD hard disk, comprising an electronic housing 54 and an electronic part 55 accommodated in the electronic housing 54. The electronic housing 54 comprises a mating interface 51 and an engaging groove 52. The mating interface 51 is electrically connected to the electronic part 55.

Figure 3:
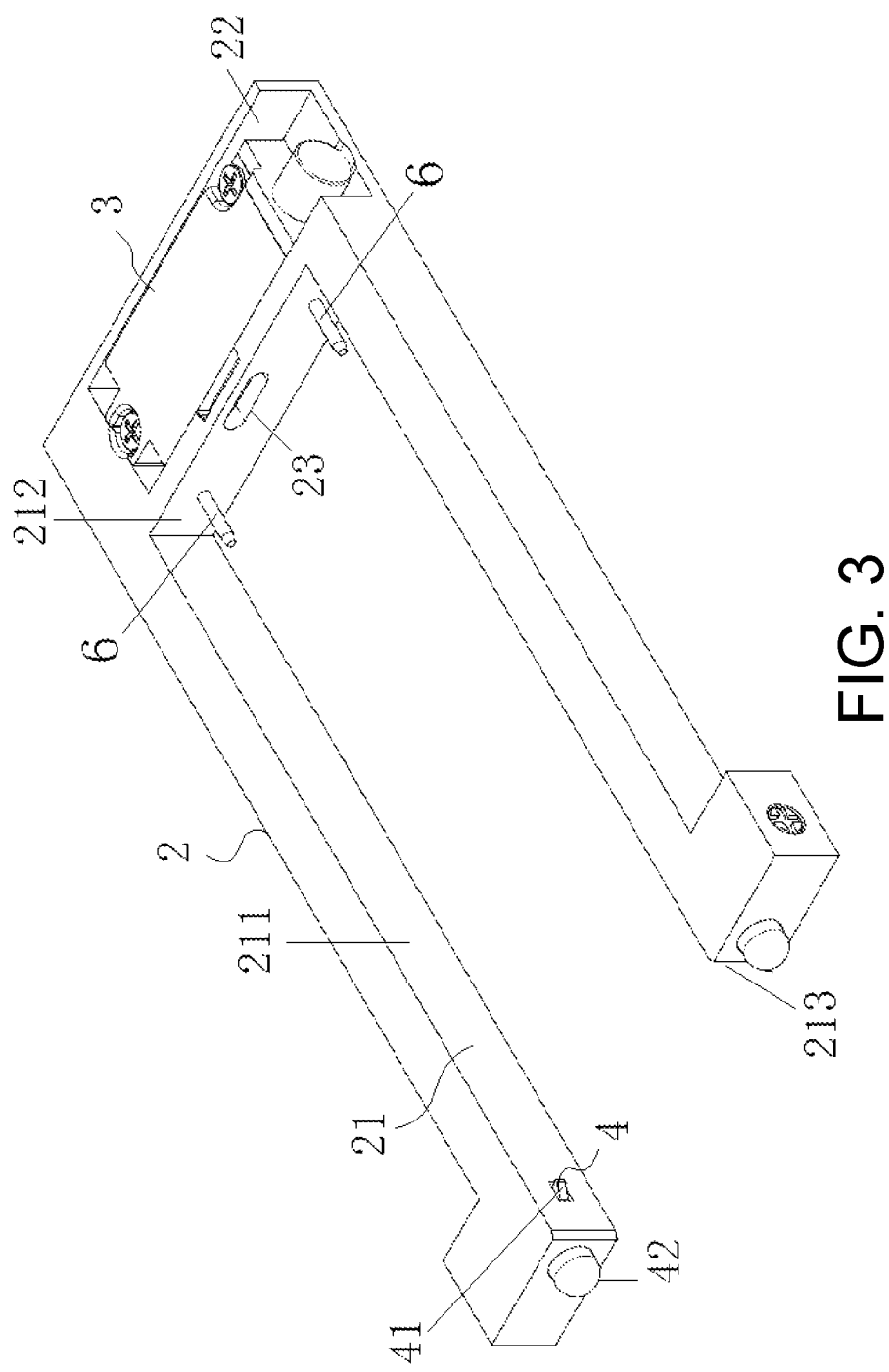
FIG. 3 is a perspective view of an adaptor of an embodiment of the present disclosure.
Figure 4:
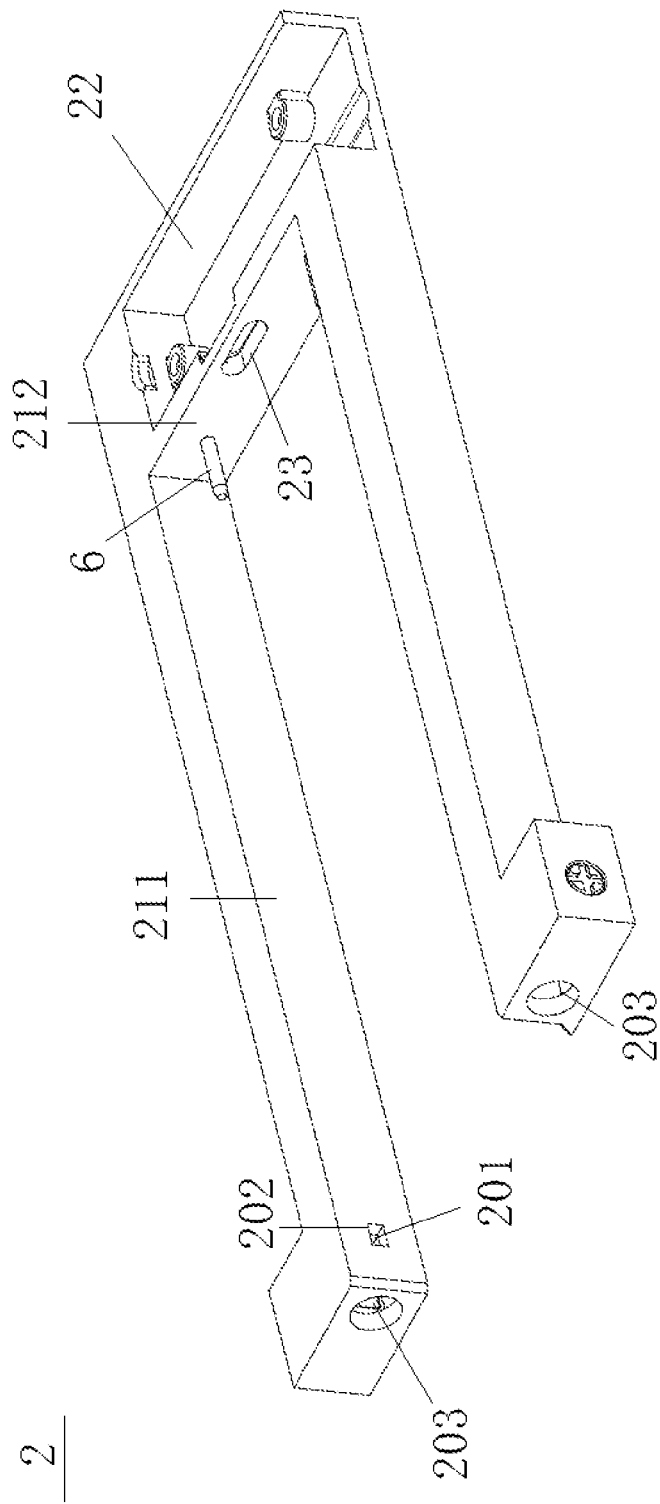
FIG. 4 is a perspective view of an adapting bracket of an embodiment of the present disclosure.

FIG. 3 is a perspective view of an adaptor of an embodiment of the present disclosure. As shown in the figure, the adaptor 1 comprises an adapting bracket 2, an adapting member 3, and at least one locking component 4. The adapting bracket 2 comprises a chute 21 comprising two opposite sidewalls 211 and a bottom wall 212. The bottom wall 212 is disposed between the two sidewalls 211. FIG. 4 is a perspective view of an adapting bracket of an embodiment of the present disclosure. As shown in the figure, the chute 21 is a rectangular groove, one end of which is provided with an opening 213. The two sidewalls 211 are two opposite sidewalls of the rectangular groove. The bottom wall 212 is a sidewall of the rectangular groove opposite to the opening 213. The size of the opening 213 matches the size of the electronic component 5 so that the electronic component 5 can be inserted into the chute 21 through the opening 213.

Figure 5:
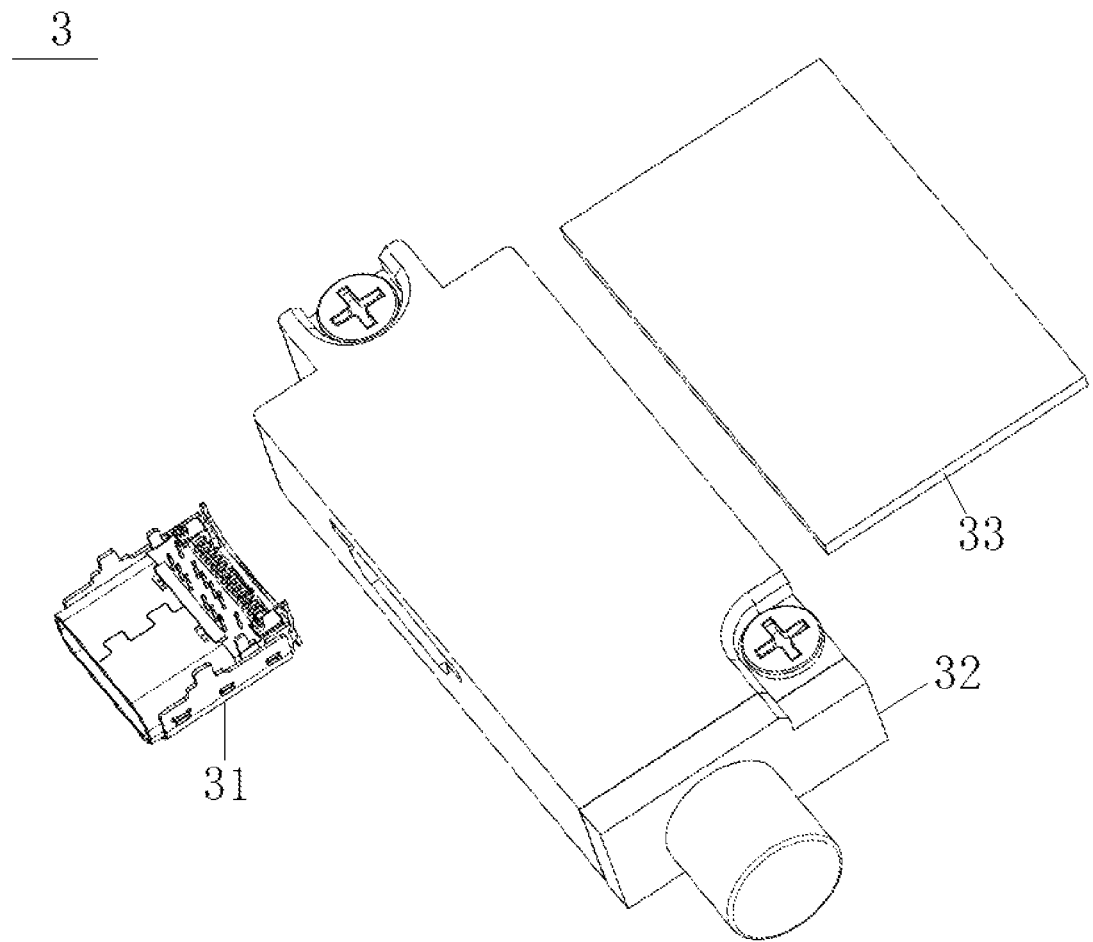
FIG. 5 is a partially exploded view of an adapting member of an embodiment of the present disclosure.

The adapting member 3 is disposed on the adapting bracket 2. FIG. 5 is a partially exploded view of an adapting member of an embodiment of the present disclosure. As shown in the figure, the adapting member 3 comprises an adapting interface 31 communicating with the chute 21. Back to FIG. 3 and FIG. 4, in this embodiment, the adapting bracket 2 comprises an installation groove 22 and a through hole 23. The installation groove 22 is disposed on one side of the bottom wall 212 away from the opening 213. The through hole 23 is disposed on the bottom wall 212 and communicates with the installation groove 22 and the chute 21. The adapting member 3 is disposed in the installation groove 22, the adapting interface 31 is disposed in the through hole 23, and the adapting member 3 is secured to the installation groove 22 by screws. Back to FIG. 3 and FIG. 5, in this embodiment, the adapting member 3 further comprises an adaptor housing 32 and a circuit board 33 covered by the adaptor housing 32. One end of the adapting interface 31 is electrically connected to the circuit board 33, and the other end protrudes from the adaptor housing 32 and is disposed in the through hole 23 for connecting with the electronic component 5. The circuit board 33 is used to connect with a computer to perform signal transferring for the electronic component 5.

Back to FIG. 3, at least one locking component 4 is disposed in the adapting bracket 2. In this embodiment, the number of locking components 4 is two. The two locking components 4 are oppositely disposed in the adapting bracket 2 and are disposed on two sides of the chute 21. In other embodiments, the number of locking components 4 could be one or more than one. Each of the locking components 4 comprises a locking member 41 extending along a direction orthogonal to the sidewall 211, i.e., the locking member 41 extends in a direction perpendicular to a surface of the sidewall 211, and movably extends into the chute 21. Referring to FIG. 1 to FIG. 5, the electronic component 5 is inserted in the chute 21, the mating interface 51 of the electronic component 5 is connected to the adapting interface 31, and the locking member 41 is inserted into the corresponding engaging groove 52. In this embodiment, the number of the engaging grooves 52 is two, into which the locking members 41 of the two electronic components 5 are inserted.

In this embodiment, when the adaptor 1 is used to adapt the electronic component 5, the electronic component 5 would be inserted into the chute 21 through the opening 213 and would slide toward the bottom wall 212 along an extending direction of the two sidewalls 211, allowing the locking members 41 of the two electronic components 5 to be pressed by the electronic components 5 to exit the chute 21 and to further enter the adapting bracket 2. When the mating interface 51 of the electronic component 5 is connected to the adapting interface 31 of the adapting member 3, the locking members 41 of the two electronic components 5 would extend into the chute 21 again and would be inserted into the corresponding engaging grooves 52 of the electronic components 5 to fix the electronic components 5 in the adapting bracket 2. In this way, the electronic component 5 can be protected by the adapting bracket 2 and can be connected to the computer or other equipment through the adapting member 3 to maintain the stability of the signal transmission performance of the electronic component 5, and to avoid damage to the electronic component 5 due to impacts. Besides, the adaptor 1 can be installed in a computer or other equipment, forming a built-in configuration that the connection circuits or interfaces between the adaptor 1 and the computer or other equipment are disposed within the computer or other equipment to prevent the adaptor 1 from being pulled to detach from the computer or other equipment by external forces to be damaged when the electronic component 5 is connected to the computer or other equipment for data transmission.

Detailed configuration of the adapting bracket 2, the locking member 41, and the locking component 4 would be described as follows. Back to FIG. 4, the adapting bracket 2 comprises a first accommodating space 201 and a locking opening 202 corresponding to each of the locking components 4. The first accommodating space 201 is disposed at one side of the chute 21 and extends along a direction orthogonal to the sidewall 211. In this embodiment, the number of the first accommodating spaces 201 is two, and the two first accommodating spaces 201 are symmetrically disposed on two sides of the chute 21. The locking opening 202 is disposed on the corresponding sidewall 211 and is in communicating with the corresponding first accommodating space 201 and the chute 21. The locking members 41 are respectively disposed in the corresponding first accommodating spaces 201. One end of the locking member 41 can protrudes from and retracts into the locking opening 202. In this embodiment, the size of the locking opening 202 is configured to be smaller than the size of the first accommodating space 201 to prevent the locking component 4 from sliding out of the first accommodating space 201 to fall.

Figure 6:
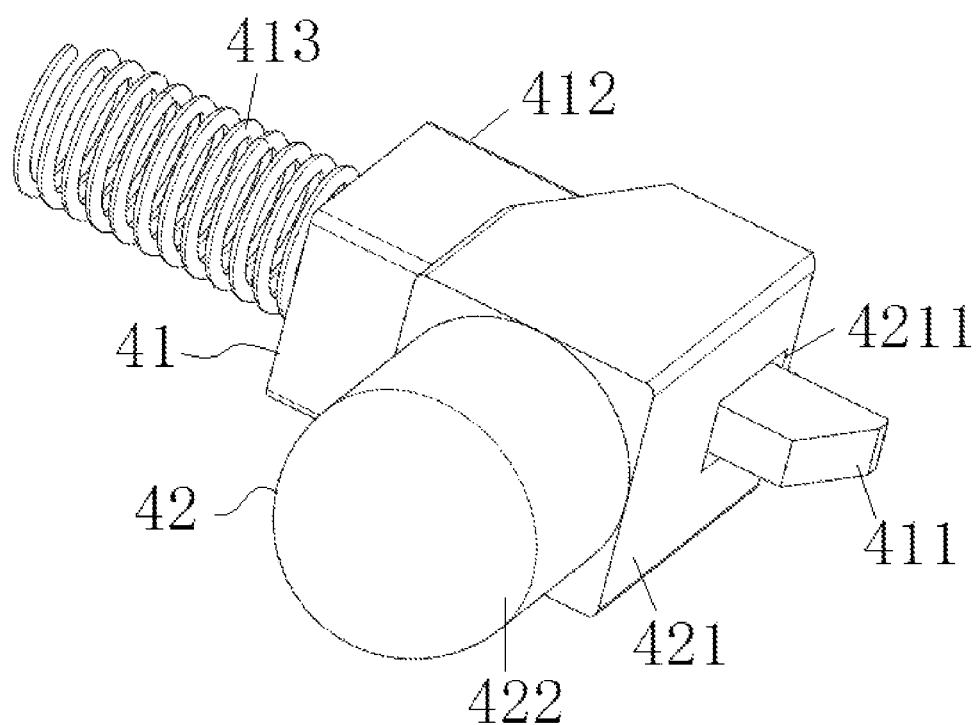
FIG. 6 is a perspective view of a locking component of an embodiment of the present disclosure.
Figure 7:
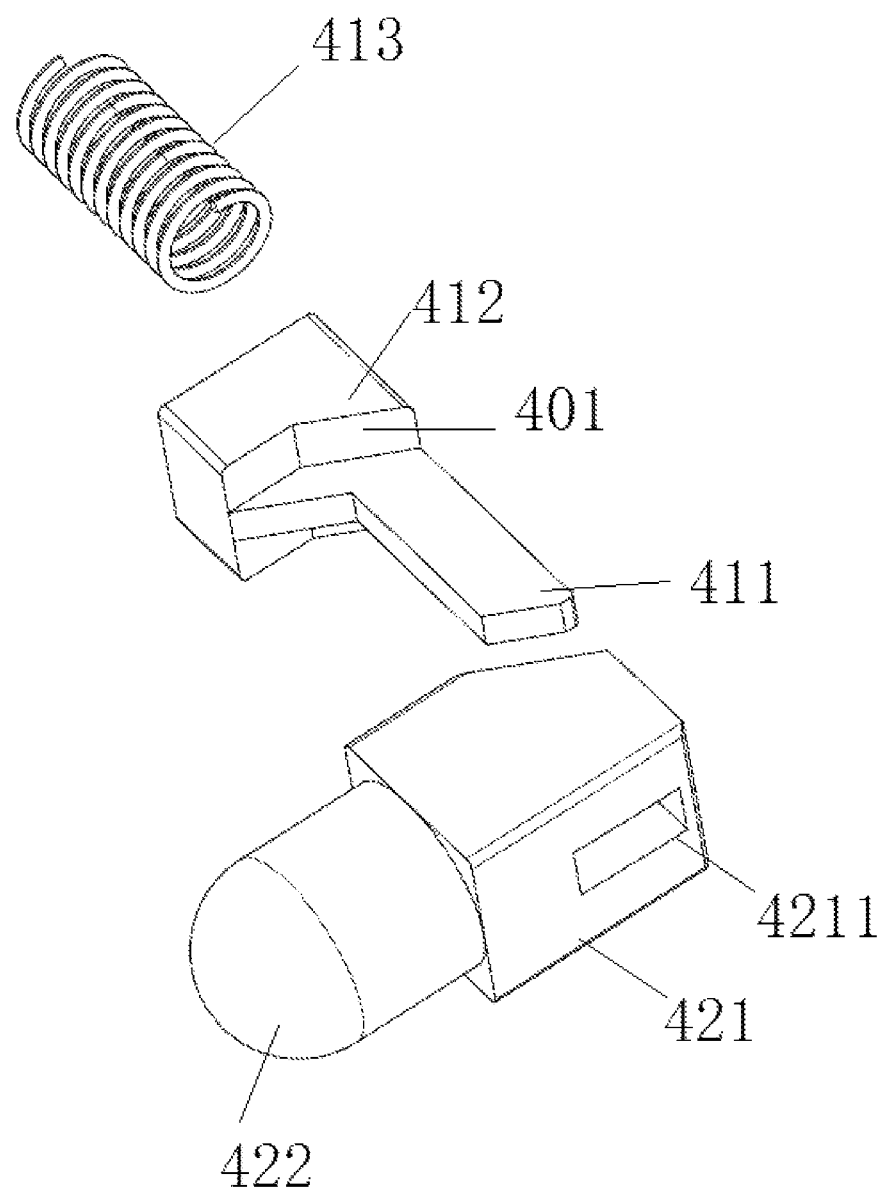
FIG. 7 is an exploded view of FIG. 6.

FIG. 6 is a perspective view of a locking component of an embodiment of the present disclosure. FIG. 7 is an exploded view of FIG. 6. As shown in the figure, the locking member 41 comprises a locking bump 411 which could protrude from and retract into the corresponding locking opening 202. In this embodiment, the locking bump 411 is flat-shaped and is inclined toward one end of the opening 213, so that the electronic component 5 can be inserted into the chute 21. Specifically, during the process of the electronic component 5 inserting into the chute 21, one side of the electronic component 5 adjacent to the sidewall 211 presses the locking member 41, so that one end of the locking member 41 is retracted into the locking opening 202. When the electronic component 5 is inserted into the chute 21, that is, when the mating interface 51 is connected to the adapting interface 31, the engaging groove 52 of the electronic component 5 would be opposite to the corresponding locking member 41, and at this moment, one side of the electronic component 5 adjacent to the sidewall 211 stops pressing the locking member 41, and the locking member 41 protrudes from the locking opening 202 and is inserted into the corresponding engaging groove 52 to fix the electronic component 5 into the adapting bracket 2.

Back to FIG. 6 and FIG. 7, the locking member 41 further comprises a first linkage block 412 connected to one end of the locking bump 411 away from the sidewall 211. The locking bump 411 and the first linkage block 412 are integrally formed to one piece, but it is not limited thereto. The locking member 41 further comprises a first elastic member 413 disposed in the first accommodating space 201. One end of the first elastic member 413 abuts against the first linkage block 412, and the other end abuts against an inner sidewall of the first accommodating space 201. The first elastic member 413 extends along the direction orthogonal to the sidewall 211. The first elastic member 413 is used to restore the locking bump 411. Specifically, when the electronic component 5 presses the locking member 41, the locking member 41 would press the first elastic member 413 through the first linkage block 412, so that the first elastic member 413 would be in an elastic state tended to push the locking member 41 to move toward the electronic component 5. When the engaging groove 52 of the electronic component 5 is opposite to the corresponding locking member 41, the first elastic member 413 would push the locking member 41 to move toward the electronic component 5, so that the locking member 41 protrudes from the locking opening 202 and is inserted into the corresponding engaging groove 52. In this embodiment, the first elastic member 413 is a spring, but it is not limited thereto.

Back to FIG. 3, each of the locking components 4 further comprises an unlocking member 42 extending along an extending direction of the sidewall 211. The locking bump 411 of each of the locking members 41 passes through the unlocking member 42. When the unlocking member 42 and the locking member 41 move relatively, the locking member 41 protrudes from or retracts into the locking opening 202. The unlocking member 42 is mainly unlocking the electronic component 5, specifically, the unlocking member 42 moves along the extending direction of the sidewall 211 to drive the locking member 41 to move toward a direction exiting the chute 21, so that the locking member 41 is pulled out from the engaging groove 52 and retracted into the locking opening 202. Thus, the electronic component 5 can be unlocked so that the electronic component 5 can be pulled out from the chute 21.

Back to FIG. 4, the adapting bracket 2 comprises a second accommodating space 203 corresponding to each of the locking components 4. The second accommodating space 203 is disposed on one side of the chute 21 and extends along the extending direction of the sidewall 211. The second accommodating space 203 is in communicating with the corresponding first accommodating space 201. In this embodiment, the number of first accommodating spaces 201 is two. The two first accommodating spaces 201 are symmetrically disposed on two sides of the chute 21, and each of the first accommodating spaces 201 is connected to the corresponding second accommodating space 203.

Referring to FIG. 3 and FIG. 4, the unlocking member 42 is disposed in the corresponding second accommodating space 203. Referring to FIG. 6 and FIG. 7, the unlocking member 42 comprises a second linkage block 421, which comprises a through hole 4211. The locking bump 411 passes through the through hole 4211, and the second linkage block 421 and the first linkage block 412 can move relatively. In this embodiment, one end of the second linkage block 421 close to the sidewall 211 is attached to a wall surface of the through hole 4211, and the attachment wall surface between the second linkage block 421 and the through hole 4211 is an inclined surface 401. When the second linkage block 421 moves toward the insertion direction of the electronic component 5, the second linkage block 421 drives the first linkage block 412 to move relatively by the driving of the inclined surface.

The unlocking member 42 further comprises a pushing bump 422, which is connected to the second linkage block 421. The pushing bump 422 and the second linkage block 421 are integrally formed to one piece, but it is not limited thereto. The pushing bump 422 protrudes from a surface of the adapting bracket 2 away from the bottom wall 212 and is used to control the relative movement between the second linkage block 421 and the first linkage block 412. In this embodiment, the pushing bump 422 is cylindrical structured, but it is not limited thereto.

Referring to FIG. 2 to FIG. 4, in this embodiment, the adaptor 1 further comprises a guiding member 6 disposed on the bottom wall 212 of the chute 22. The electronic component 5 comprises a guiding groove 53. When the electronic component 5 is inserted in the chute 21, the guiding member 6 enters the guiding groove 53. The guiding member 6 is used to guide the electronic component 5 to prevent the electronic component 5 from being inserted biasedly. In this embodiment, the number of the guiding members 6 and the number of the guiding grooves 53 are both two. The two guiding members 6 are symmetrically disposed on two sides of the opening 213, and the two guiding grooves 53 are symmetrically disposed on two sides of the mating interface 51. The position of the guiding member 6 and the guiding groove 53 can be changed according to the design of the adaptor 1 and the electronic component 5. That is, the guiding groove 53 can be disposed on the bottom wall 212, and the guiding member 6 can be disposed on the electronic component 5. In this embodiment, the guiding member 6 is a cylindrical rod, but it is not limited thereto.

The electronic component 5 further comprises a second elastic member 56 disposed in the guiding groove 53. When the guiding member 6 enters the guiding groove 53, it would compress the second elastic member 56. The second elastic member 56 is mainly used to eject the electronic component 5 from the chute 21, specifically, when the electronic component 5 is inserted into the chute 21, the guiding member 6 would enter the guiding groove 53 to compress the second elastic member 56 so that the second elastic member 56 is in an elastic state tend to push the electronic component 5 out of the chute 21. When the unlocking member 42 drives the locking member 41 to be pulled out from the engaging groove 52, the second elastic member 56 would push the electronic component 5 to move toward the opening 213, so that the electronic component 5 would be ejected from the chute 21. In this embodiment, the second elastic member 56 is a spring, but it is not limited thereto.

Figure 8:
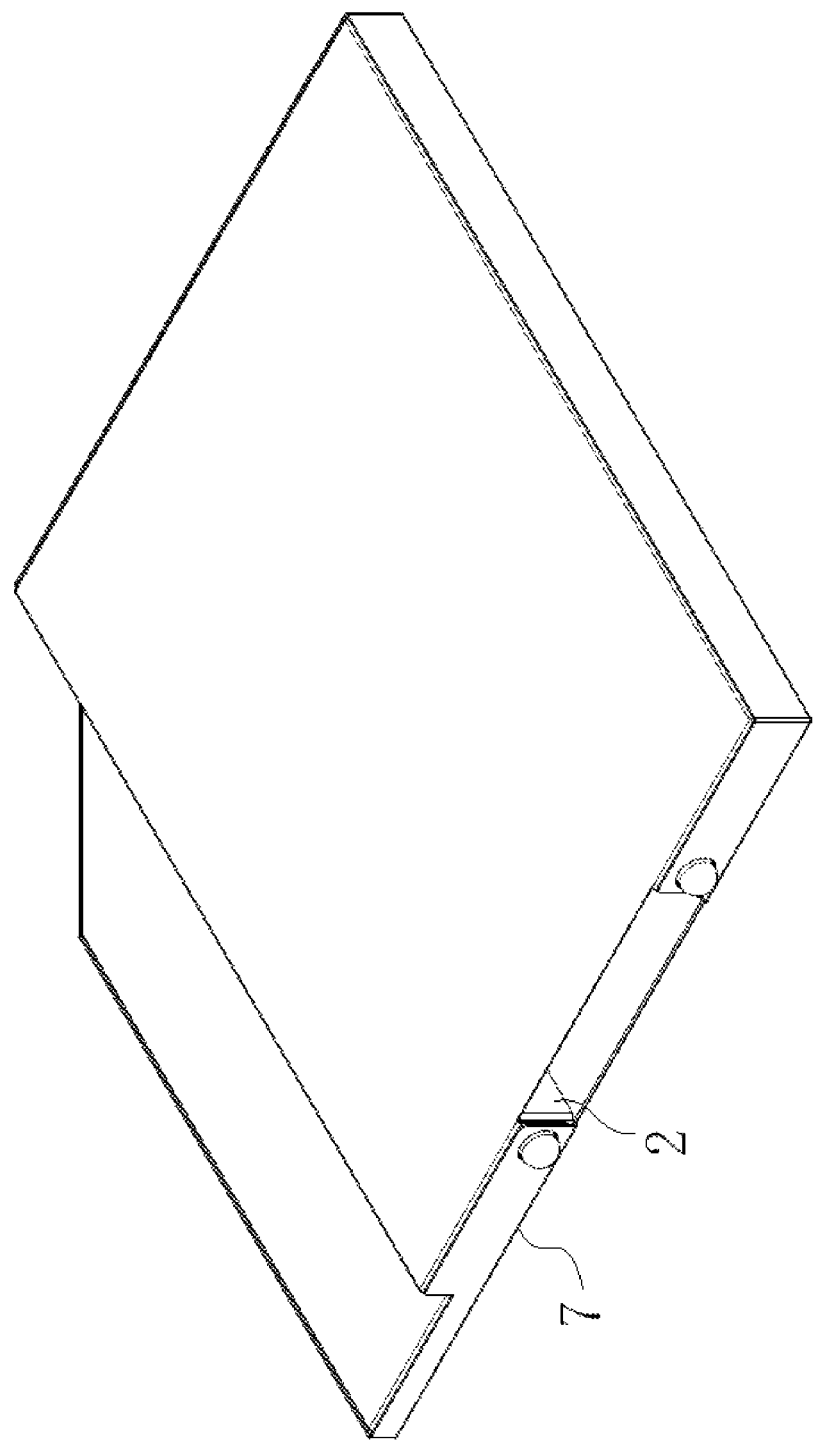
FIG. 8 is a perspective view of a housing covering an adapting bracket of an embodiment of the present disclosure.
Figure 9:
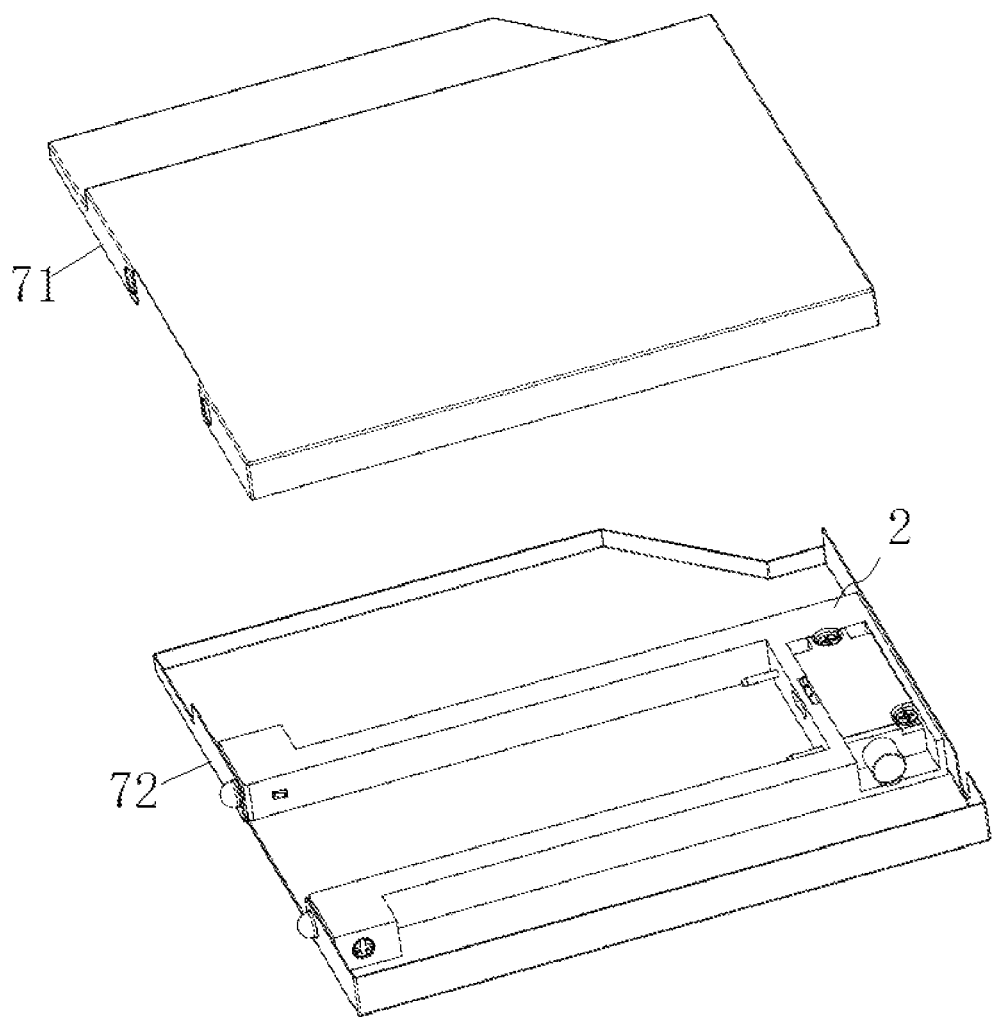
FIG. 9 is a partially exploded view of FIG. 8.

FIG. 8 is a perspective view of a housing covering an adapting bracket of an embodiment of the present disclosure. In this embodiment, the adaptor 1 further comprises a housing 7 which covers the adapting bracket 2. In this embodiment, the housing 7 could completely cover the adapting bracket 2. In other embodiments, the housing 7 could cover a surface or a part of the adapting bracket 2. Specifically, referring to FIG. 9, a partially exploded view of FIG. 8, as shown in the figure, the housing 7 of this embodiment comprises an upper housing 71 and a lower housing 72. The upper housing 71 corresponds to the contour, shape, and structure of the lower housing 72 so that the upper housing 71 can be engaged with and secured to the lower housing 72 to cover the adapting bracket 2. In this embodiment, there could be no special requirements for the selection of the housing 7. Those skilled in the art can refer to the conventional solution or corresponding designing according to the description of the present disclosure.

In summary, embodiments of the present disclosure provide an adaptor. By disposing the adapting member and at least one locking component onto the adapting bracket, the mating interface of the electronic component is connected to the adapting interface of the adapting member, and the locking member of each of the locking components is inserted into a corresponding engaging groove when the electronic component is inserted in the chute of the adapting bracket to fix the electronic components in the adapting bracket. Besides, since electronic components are connected to computers or other equipment through adaptors, they can be protected by the adapting bracket to avoid being damaged by impact. Furthermore, the adaptor can be installed on a computer or other equipment to form a built-in configuration, of which the connection or interfaces between the adaptor and the computer or other equipment are in the computer or other equipment to prevent the adaptor from being pulled to detach from the computer or other equipment by external forces and to prevent electronic components from detaching from the computer or other equipment and further damage when they are connected to the computer or other equipment for data transmission.

Meanwhile, each of the locking components of the present disclosure further comprises an unlocking member. Through the relative movement between the unlocking member and the locking member, the locking member can be pulled out from the engaging groove to unlock the electronic component. Thus, the electronic component can be pulled out from the sliding groove. The present disclosure is further provided with a second elastic member. When the unlocking member drives the locking member to be pulled out from the engaging groove, the second elastic member would push the electronic component to eject from the chute, so that the electronic component can be quickly removed from the chute. Thus, the disadvantages of electronic components that are difficult to remove are solved.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. An adaptor for a portable hard disk, comprising:
an adapting bracket comprising a chute comprising two opposite sidewalls, a bottom wall, a first accommodating space and a locking opening, the bottom wall being disposed between the two opposite sidewalls, and the first accommodating space is disposed on one side of the chute and extends along a direction orthogonal to a first sidewall; the locking opening is disposed on the first sidewall and communicates with the first accommodating space and the chute;
an adapting member disposed on the adapting bracket, the adapting member comprising an adapting interface and being in communicating with the chute;
at least one locking component disposed in the adapting bracket, the at least one locking component comprising a locking member movably extending into the chute, the locking member respectively disposed in the first accommodating space, one end of the locking member extended from and retracted into the locking opening, the locking member comprising a locking bump, a first linkage block, a first elastic member and an unlocking member, the locking bump extended from and retracted into the locking opening, one end of the locking bump away from the first sidewall connected to the first linkage block, and the first elastic member disposed in the first accommodating space; one end of the first elastic member abutted against the first linkage block; the other end of the first elastic member abutted against an inner sidewall of the first accommodating space; the first elastic member extended along a direction orthogonal to the first sidewall, the unlocking member extended in a direction parallel to the first sidewall; the locking bump of each of the locking member passed through the unlocking member; when the unlocking member moved relative to the locking member, the locking member extended from or retracted into the locking opening;
wherein the locking opening corresponding to each of the locking component when an electronic component is inserted in the chute, a mating interface of the electronic component is connected to the adapting interface, and the locking member is inserted into an engaging groove of the electronic component.

2. The adaptor for a portable hard disk according to claim 1, wherein the locking component further comprises the unlocking member extending in a direction parallel to the sidewall; the locking bump of each of the locking members passes through the unlocking member; when the unlocking member moves relative to the locking member, the locking member extends from or retracts into the locking opening.

3. The adaptor for a portable hard disk according to claim 2, wherein the adapting bracket comprises a second accommodating space corresponding to a second locking component; the second accommodating space is disposed on another side of the chute and extends along the direction parallel to a second sidewall; the second accommodating space is in communication with the first accommodating space; a second unlocking member of the second locking component is disposed in the second accommodating space.

4. The adaptor for a portable hard disk according to claim 3, wherein the second unlocking member comprises a second linkage block comprising a through hole; a second locking bump passes through the through hole; the second linkage block moves relative to the first linkage block.

5. The adaptor for a portable hard disk according to claim 3, wherein the second unlocking member further comprises a pushing bump connected with a second linkage block; the pushing bump protrudes from a surface of the adapting bracket away from the bottom wall.

6. The adaptor for a portable hard disk according to claim 1, wherein the adapting bracket comprises a second accommodating space corresponding to a second locking component; the second accommodating space is disposed on another side of the chute and extends along the direction parallel to a second sidewall; the second accommodating space is in communication with the first accommodating space; a second unlocking member of the second locking component is disposed in the second accommodating space.

7. The adaptor for a portable hard disk according to claim 6, wherein the second unlocking member comprises a second linkage block comprising a through hole; a second locking bump passes through the through hole; the second linkage block moves relative to the first linkage block.

8. The adaptor for a portable hard disk according to claim 6, wherein the second unlocking member further comprises a pushing bump connected with a second linkage block; the pushing bump protrudes from a surface of the adapting bracket away from the bottom wall.

9. The adaptor for a portable hard disk according to claim 1 further comprising a guiding member disposed on the bottom wall of the chute, the electronic component comprising a guiding groove; wherein when the electronic component is inserted into the chute, the guiding member enters the guiding groove.

10. The adaptor for a portable hard disk according to claim 9, wherein the electronic component further comprises a second elastic member disposed in the guiding groove; when the guiding member enters the guiding groove, the guiding member compresses the second elastic member.

11. The adaptor for a portable hard disk according to claim 1 further comprising a housing covering the adapting bracket.

12. The adaptor for a portable hard disk according to claim 1, wherein the number of locking component is two; the two locking components are oppositely disposed in the adapting bracket and are disposed on two sides of the chute; the number of the engaging groove is two; the two locking members are respectively inserted into the corresponding engaging grooves.

* * * * *